(12) United States Patent
Fukuhara et al.

(10) Patent No.: US 8,174,587 B2
(45) Date of Patent: May 8, 2012

(54) IMAGING APPARATUS, INTEGRATED CIRCUIT FOR IMAGE PICKUP DEVICE AND IMAGE DATA PROCESSING METHOD

(75) Inventors: Takahiro Fukuhara, Kanagawa (JP); Tadakuni Narabu, Kanagawa (JP)

(73) Assignee: Sony Corporation, Tokyo (JP)

( * ) Notice: Subject to any disclaimer, the term of this patent is extended or adjusted under 35 U.S.C. 154(b) by 479 days.

(21) Appl. No.: 11/631,941

(22) PCT Filed: Jun. 22, 2005

(86) PCT No.: PCT/JP2005/011883
§ 371 (c)(1),
(2), (4) Date: Feb. 5, 2008

(87) PCT Pub. No.: WO2006/006396
PCT Pub. Date: Jan. 19, 2006

(65) Prior Publication Data
US 2008/0266410 A1  Oct. 30, 2008

(30) Foreign Application Priority Data
Jul. 9, 2004  (JP) ................................. 2004-202575

(51) Int. Cl.
*H04N 5/76* (2006.01)
*H04N 5/228* (2006.01)
*H04N 11/02* (2006.01)
*G06K 9/46* (2006.01)
*G06K 9/36* (2006.01)

(52) U.S. Cl. ................. 348/231.6; 348/222.1; 382/166; 382/238; 382/232; 372/240.12; 372/240

(58) Field of Classification Search ............... 348/222.1, 348/231.6; 382/166, 232–253; 375/240–240.99, 375/240.12
See application file for complete search history.

(56) References Cited

U.S. PATENT DOCUMENTS
6,067,383 A * 5/2000 Taniguchi et al. ............ 382/240
(Continued)

FOREIGN PATENT DOCUMENTS
JP  04-170174  6/1992
(Continued)

OTHER PUBLICATIONS

Notification of Reasons for Rejection, issued by Japanese Patent Office, dated Oct. 18, 2011, in Japanese Patent Application No. 2010-166998, (3 pages).

*Primary Examiner* — Sinh Tran
*Assistant Examiner* — Mark Monk
(74) *Attorney, Agent, or Firm* — Finnegan, Henderson, Farabow, Garrett & Dunner, L.L.P.

(57) ABSTRACT

The present invention is applied to imaging apparatuses including video cameras for recording moving pictures, electronic still cameras, monitoring devices and such. An image pickup means 3 and an image compressing means 5 are connected integrally by a wiring layer formed on a surface of the image pickup means 3 opposite a light-receiving surface of the image pickup means 3. The image pickup means 3 provides processing units of image data S1 relating to an image compressing process sequentially. Image data on a partial area in an effective image area is compressed to detect a code amount in advance. A data compressing ratio is determined on the basis of the code amount, and the image data is compressed at the image compressing ratio.

10 Claims, 14 Drawing Sheets

U.S. PATENT DOCUMENTS

| | | |
|---|---|---|
| 6,560,369 B1 | 5/2003 | Sato |
| 7,142,722 B2 * | 11/2006 | Fukuhara et al. ............. 382/240 |
| 2002/0064232 A1 | 5/2002 | Fukuhara et al. |
| 2003/0025160 A1 | 2/2003 | Suzuki et al. |
| 2003/0214595 A1 * | 11/2003 | Mabuchi ...................... 348/294 |
| 2004/0005729 A1 | 1/2004 | Abe et al. |

FOREIGN PATENT DOCUMENTS

| | | |
|---|---|---|
| JP | 06-303533 | 10/1994 |
| JP | 08-186766 | 7/1996 |
| JP | 10-224696 | 8/1998 |
| JP | 11-177893 | 7/1999 |
| JP | 2000-023053 | 1/2000 |
| JP | 2000-032481 | 1/2000 |
| JP | 2000-050293 | 2/2000 |
| JP | 2000-184204 | 6/2000 |
| JP | 2001-015725 | 1/2001 |
| JP | 2001-145105 | 5/2001 |
| JP | 2001-298669 | 10/2001 |
| JP | 2002-165098 | 6/2002 |
| JP | 2003-31785 | 1/2003 |
| JP | 2003-031785 | 1/2003 |
| JP | 2003-516700 | 5/2003 |
| JP | 2003-234967 | 8/2003 |
| JP | 2003-273343 | 9/2003 |
| JP | 2003-338615 | 11/2003 |

\* cited by examiner

FIG. 1

| | CCD | CMOS |
|---|---|---|
| BASIC CONSTRUCTION | SERIAL IMAGE OUTPUT DEVICE (PASSIVE SENSOR) | MULTIARRAY CCD (ACTIVE SENSOR) |
| MOST SIGNIFICANT FEATURE | SINGLE FUNCTION | MULTIPLE-FUNCTION HIGH-FUNCTION |
| READING SYSTEM | SERIAL (RESTRICTIONS ON READING) | XY ADDRESSING (HIGH DEGREE OF FREEDOM OF READING) |
| INTERPIXEL CHARACTERISTIC | HIGH INTERPIXEL UNIFORMITY | INTERPIXEL CHARACTERISTIC DIFFERENCE |
| SPEED | CONTINUOUS HIGH-SPEED OPERATION IS DIFFICULT | CONTINUOUS HIGH-SPEED OPERATION IS EASY |
| ACCUMULATING TIME AND ENDING TIME | ALL PIXELS SIMULTANEOUSLY | ESSENTIALLY DIFFERENT TIME IN COLUMNS OR PIXELS |
| POWER CONSUMPTION | LARGE | SMALL |

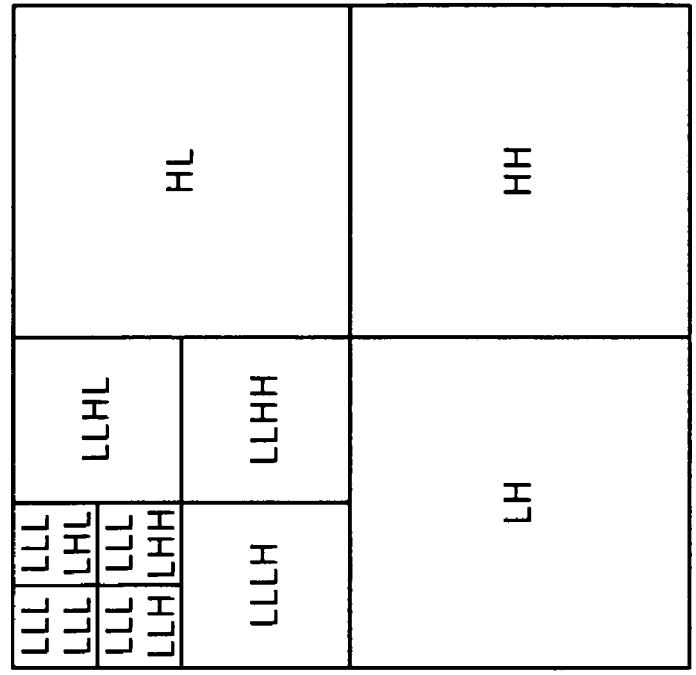
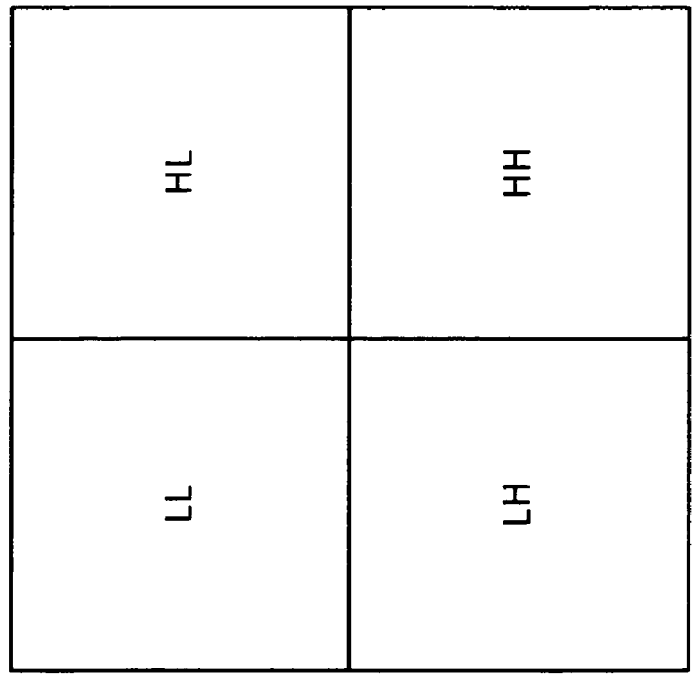

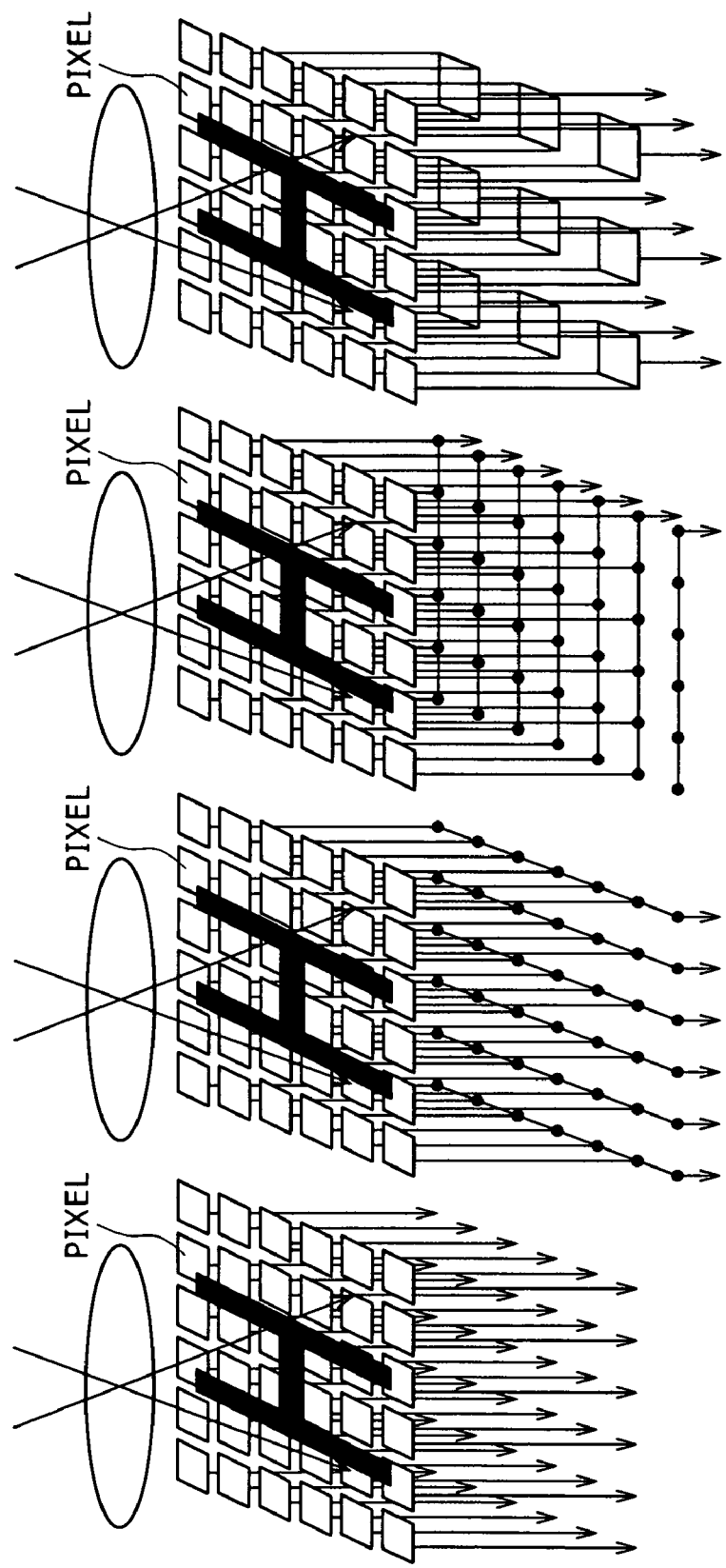

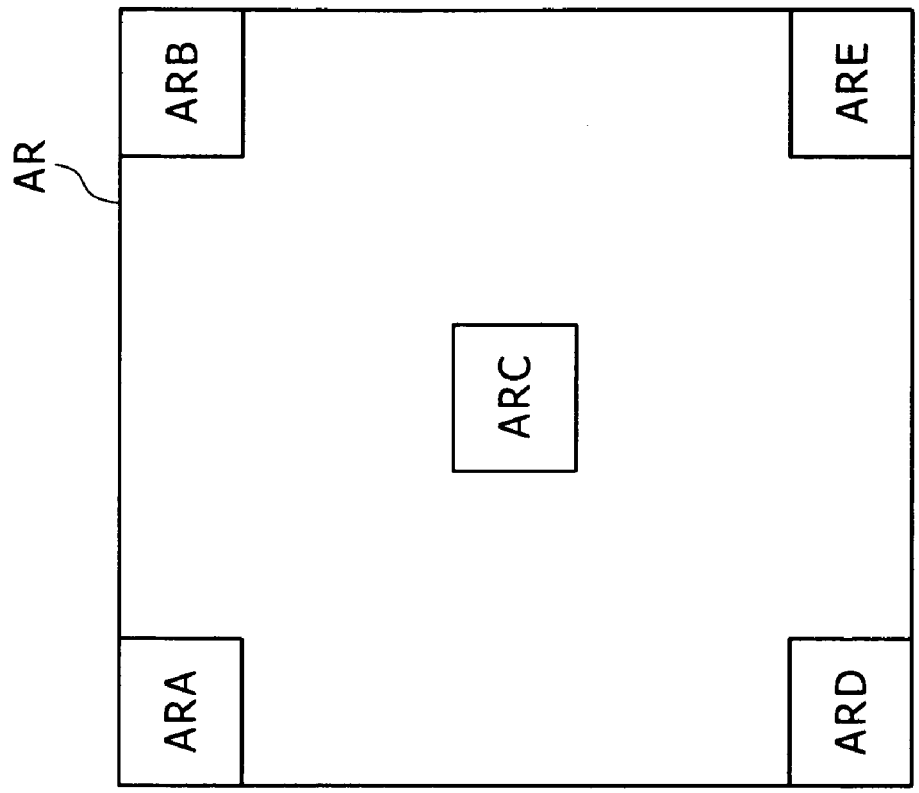

IMAGING APPARATUS, INTEGRATED CIRCUIT FOR IMAGE PICKUP DEVICE AND IMAGE DATA PROCESSING METHOD

FIELD OF THE INVENTION

The present invention relates to an imaging apparatus, an integrated circuit for an image pickup device and an image data processing method to be applied to video cameras capable of recording moving pictures, electronic still cameras and monitoring devices. An image pickup means is combined with an image compressing means by connecting a wiring layer formed on a surface of the image pickup means opposite the image pickup surface of the image pickup means to the image compressing means. Images picked up by the image pickup means are sent out successively in processing units for an image compression process to utilize effectively the high degree of freedom of reading image data on a picked-up image characterizing an image pickup device, such as a CMOS solid state image pickup device for the further simplification of general construction. The amount of codes produced through the compression of data on a partial area in an effective image area is measured, the data compressing ratio is changed according to the measured amount of codes to compress data on picked-up images is compressed. Thus the high degree of freedom of reading picked-up images characterizing a CMOS solid state image pickup device is effectively utilized, and rate control can be achieved more properly by a simple process as compared with a conventional process.

BACKGROUND ART

A video camera holds images data provided by a CCD (charge coupled device) solid state image pickup device by a frame memory and compresses blocks of image data by a MPEG (Moving Picture Experts Groups) method. An electronic still camera, similarly to the video camera, holds image data provided by a CCD solid state image pickup device by a frame memory and compresses blocks of image data by a JPEG (Joint Photographic Experts Group) method.

In recent years, CMOS solid state image pickup devices have been put to practical use. FIG. 1 shows the characteristics of the CCD solid state image pickup device in comparison with those of the CMOS image pickup device. As shown in FIG. 1, the CMOS image pickup device has many distinctive characteristics. For example, whereas the CCD image pickup device uses the same charge storage start and end times for all pixels, the CMOS image pickup device used different charge storage start and end times for different columns or pixels.

Particularly, whereas the CCD image pickup device reads data on pixels in a serial transmission mode as shown in FIG. 2, the CMOS image pickup device can read data on pixels in an X-Y address control mode as shown in FIG. 3. Thus the degree of freedom of reading of the CMOS image pickup device is higher than that of the CCD image pickup device. FIG. 2 is a typical view illustrating a mode of output of image data from the CCD image pickup device. In the CCD image pickup device, charges held by the pixels are transferred to a vertical transfer register, the transferred charges are transferred sequentially to a horizontal transfer resister and the horizontal transfer resister provides the charges sequentially as shown in FIG. 2. FIG. 3 is a typical view illustrating a mode of output of image data from the CMOS image pickup device. In the CMOS image pickup device, charges held by pixels on each column are provided sequentially.

More concretely, in the CMOS image pickup device, MOSFETs included in pixels are selectively turned on by horizontal address lines and vertical address lines to send out image data from the selected pixels to signal lines. In the CMOS image pickup device shown in FIG. 3 by way of example, a plurality of pixels successively arranged on each vertical line use one signal line for one column line, the respective conditions of the horizontal address lines respectively corresponding to the pixels on each column line are changed sequentially to turn on the MOSFETs included in those pixels sequentially. Thus the column line is assigned to the pixels successively arrange in a vertical direction in a time-sharing mode to send out image data from the pixels. The pixels successively arranged on each horizontal line are connected to each horizontal address line. Therefore, the assignment of the pixels successively arranged in a vertical direction to the column line in a time-sharing mode is carried out simultaneously for the pixels successively arranged in a horizontal direction to provide image on each line.

A CMOS image pickup device similar to the foregoing CMOS image pickup device and peripheral circuits are proposed in, for example, JP 2004-31785 A.

Various coding methods relating to such image data processing have been proposed. Those coding methods uses a wavelet transform process. The wavelet transform process divides high-frequency image data and low-frequency image data by a band division process with respect to the horizontal and the vertical direction, divides the image data into four subbands by down sampling. For example, the band division process is performed once to divide image data into four subbands HH, HL, LH and LL as shown in FIG. 4(A) or the band division process is repeated to divide image data into subbands as shown in FIG. 4(B). FIG. 4(B) shows the results of repetition of the band division process three times. The subband LL having a low frequency with respect to the horizontal and the vertical direction among the subbands HH, HL, LH and LL is subjected to the band division process to divide the subband LL into four subbands LLHH, LLHL, LLLH and LLLL, and the subband LLLL having a low frequency with respect to the horizontal and the vertical direction among the subbands LLHH, LLHL, LLLH and LLLL is subjected to the band division process into four subbands LLLLHH, LLLLHL, LLLLLH and LLLLLL.

Previously proposed wavelet transform processes for the coding process includes a line-base wavelet transform process that processes image data on each of lines and a tile-base wavelet transform process that processes image data on each of tiles, namely rectangular blocks defined in each of pictures.

It is expected that the construction of the imaging apparatus can be further simplified and the rate can be controlled more properly by a simple process as compared with a known process if the high degree of freedom of reading image data characterizing the MOS image pickup device, can be effectively used. Incidentally, different parts of an image have different degrees of coding difficulty. Therefore, if a coding process uses the MPEG method, fine rate control is performed by, for example, a TM5 method (test mode 5 method).

DISCLOSURE OF THE INVENTION

The present invention has been made in view of the foregoing points and it is therefore an object of the present invention to provide an imaging apparatus of simple construction capable of effectively utilizing the high degree of freedom of reading image data characterizing the CMOS solid state image pickup device, an integrated circuit included in an image pickup device for the imaging apparatus and image data processing method. Another object of the present invention is to provide an imaging apparatus capable more properly achieving rate control by a simple process as compared with a conventional process by effectively utilizing the high degree of freedom of reading image data characterizing the CMOS image pickup device, an integrated circuit for an image pickup device and an image data processing method.

An imaging apparatus according to the present invention includes: an image pickup means having a plurality of photoelectric converters arranged in a matrix from which image data is obtained by XY address control; and a peripheral circuit connected to the photoelectric converters by a wiring layer formed on a surface of the image pickup means opposite a light-receiving surface of the image pickup means and held integrally with the image pickup means to process image data provided by the image pickup means and to provide the processed image data; wherein the peripheral circuit includes at least an image compressing means for compressing predetermined processing units of the image data and providing compressed processing units of the image data, and the image pickup means provides image data sequentially from the photoelectric converters in the processing units of the image data to be processed by the peripheral circuit.

In the imaging apparatus according to the present invention including the image pickup means having the plurality of photoelectric converters arranged in a matrix from which image data is obtained by XY address control, and the peripheral circuit connected to the photoelectric converters by the wiring layer formed on the surface of the image pickup means opposite the light-receiving surface of the image pickup means and held integrally with the image pickup means to process the image data provided by the image pickup means and to provide the processed image data, the photoelectric converters of the image pickup means are connected to the peripheral circuit by the wiring layer formed on the surface of the image pickup means opposite the light-receiving surface of the image pickup means. Therefore, various troubles that may occur when the wiring layer is formed on the light receiving surface can be effectively avoided, the photoelectric converters can be connected to the peripheral circuit in at a high degree of freedom of connection and the image data provided by the image pickup means can be transmitted in various modes to the peripheral circuit without reducing the high degree of freedom of reading image data of the image pickup means. When the peripheral circuit includes at least the image compressing means for compressing predetermined processing units of the image data and providing compressed processing units of the image data, and the image pickup means provides image data provided by the photoelectric converters sequentially in the processing units of the image data to be processed by the peripheral circuit, the image data provided by the image pickup means can be sequentially compressed, a memory having a small storage capacity can be used for the data compressing process by effectively utilizing the high degree of freedom of reading the image data of the image pickup means and hence the construction of the imaging apparatus can be simplified.

An imaging apparatus according to the present invention includes: an image pickup means having a plurality of photoelectric converters arranged in a matrix from which image data is obtained by XY address control, and a peripheral circuit connected to the photoelectric converters by a wiring layer formed on a surface of the image pickup means opposite a light-receiving surface of the image pickup means and held integrally with the image pickup means to process image data provided by the image pickup means and to provide the processed image data; wherein the peripheral circuit includes at least an image compressing means for compressing predetermined processing units of the image data and providing compressed processing units of the image data, image data is obtained from a partial area in an effective image area in the image pickup means in advance, the image data thus obtained is compressed to detect a code amount, and the image data is compressed at a data compression ratio based on the detected code amount.

In the imaging apparatus according to the present invention including: the image pickup means having the plurality of photoelectric converters arranged in a matrix from which image data is obtained by XY address control, and the peripheral circuit connected to the photoelectric converters by the wiring layer formed on the surface of the image pickup means opposite the light-receiving surface of the image pickup means and held integrally with the image pickup means to process image data provided by the image pickup means and to provide the processed image data, the peripheral circuit is connected to the photoelectric converters of the image pickup means by the wiring circuit formed on the surface opposite the light-receiving surface. Therefore, various troubles that may occur when the wiring layer is formed on the light receiving surface can be effectively avoided, the photoelectric converters can be connected to the peripheral circuit at a high degree of freedom of connection and the image data provided by the image pickup means can be transmitted in various modes to the peripheral circuit without reducing the high degree of freedom of reading image data of the image pickup means. When the peripheral circuit includes at least an image compressing means for compressing image data and providing compressed image data, and image data is obtained from a partial area in an effective image area in the image pickup means in advance, the image data thus obtained is compressed to detect a code amount, and the image data is compressed at a data compression ratio based on the detected code amount, rate control can be more properly achieved by a simple process as compared with a conventional process by effectively utilizing the high degree of freedom of reading image data.

An integrated circuit according to the present invention for an image pickup device including an image pickup means having a plurality of photoelectric converters arranged in a matrix from which image data is obtained by XY address control, and a peripheral circuit connected to the photoelectric converters by a wiring layer formed on a surface of the image pickup means opposite a light-receiving surface of the image pickup means and held integrally with the image pickup means to process image data provided by the image pickup means and to provide the processed image data; wherein the peripheral circuit includes at least an image compressing means for compressing predetermined processing units of the image data and providing compressed processing units of the image data, and the image pickup means provides image data provided by the photoelectric converters sequentially in the processing units of the image data to be processed by the peripheral circuit.

The integrated circuit for the image pickup device can simplify the construction by effectively utilizing high degree of freedom of reading image data.

An integrated circuit according to the present invention for an image pickup device including an image pickup means having a plurality of photoelectric converters arranged in a matrix from which image data is obtained by XY address control, and a peripheral circuit connected to the photoelectric converters by a wiring layer formed on a surface of the image pickup means opposite a light-receiving surface of the image pickup means and held integrally with the image pickup means to process image data provided by the image pickup means and to provide the processed image data;

wherein the peripheral circuit includes at least an image compressing means for compressing the image data and providing compressed image data, image data is obtained from a partial area in an effective image area in the image pickup means in advance, the image data thus obtained is compressed to detect a code amount, and the image data is compressed at a data compression ratio based on the detected code amount.

Thus the integrated circuit for the image pickup device can more properly achieve rate control by a simple process as compared with the conventional process by effectively utilizing the high degree of freedom of reading image data.

An image data processing method according to the present invention to be carried out by an imaging apparatus including an image pickup means having a plurality of photoelectric converters arranged in a matrix, and a peripheral circuit connected to the photoelectric converters by a wiring layer formed on a surface of the image pickup means opposite a light-receiving surface of the image pickup means and held integrally with the image pickup means includes the steps of: providing image data from the image pickup means by XY address control; and compressing predetermined processing units of image data and providing the compressed processing units of image data by the peripheral circuit; wherein the step of providing the image data provides the image data provided by the plurality of photoelectric converters in the processing units to be used by the peripheral circuit sequentially from the image pickup means.

Thus the image data processing method can simplify the construction by effectively utilizing high degree of freedom of reading image data.

An image data processing method according to the present invention to be carried out by an imaging apparatus including an image pickup means having a plurality of photoelectric converters arranged in a matrix, and a peripheral circuit connected to the photoelectric converters by a wiring layer formed on a surface of the image pickup means opposite a light-receiving surface of the image pickup means and held integrally with the image pickup means includes the steps of: providing image data from the image pickup means by XY address control; compressing image data and providing the compressed image data at least by the peripheral circuit; obtaining image data from a partial area in an effective image area in the image pickup means in advance; and detecting a code amount by compressing the image data thus obtained; wherein the step of compressing the image data compresses the image data at a data compression ratio based on the detected code amount.

Thus the image data processing method can simplify the construction by effectively utilizing high degree of freedom of reading image data.

An image data processing method according to the present invention to be carried out by an integrated circuit included in an image pickup device including an image pickup means having a plurality of photoelectric converters arranged in a matrix, and a peripheral circuit connected to the photoelectric converters by a wiring layer formed on a surface of the image pickup means opposite a light-receiving surface of the image pickup means and held integrally with the image pickup means includes the steps of: providing image data from the image pickup means by XY address control; compressing at least predetermined processing units of image data and providing the compressed processing units of image data by the peripheral circuit; wherein the step of providing the image data provides the image data from the plurality of photoelectric converters sequentially in the processing units of image data to be processed by the peripheral circuit.

Thus the image data processing method can simplify the construction by effectively utilizing high degree of freedom of reading image data.

An image data processing method according to the present invention to be carried out by an integrated circuit included in an image pickup device including an image pickup means having a plurality of photoelectric converters arranged in a matrix, and a peripheral circuit connected to the photoelectric converters by a wiring layer formed on a surface of the image pickup means opposite a light-receiving surface of the image pickup means and held integrally with the image pickup means includes the steps of: providing image data from the image pickup means by XY address control; compressing the image data and providing the compressed image data at least by the peripheral circuit; obtaining image data from a partial area in an effective image area in the image pickup means in advance; and detecting a code amount by compressing the image data thus obtained; wherein the step of compressing the image data compresses the image data at a data compression ratio based on the detected code amount.

Thus the image data processing method can more properly achieving rate control by a simple process as compared with a conventional process by effectively utilizing the high degree of freedom of reading image data.

According to the present invention, the construction can be simplified by effectively utilizing the high degree of freedom of reading image data. Rate control can be more properly achieved by a simple process as compared with a conventional process by effectively utilizing the high degree of freedom of reading image data.

BRIEF DESCRIPTION OF THE DRAWINGS

FIG. 1 is a table comparatively showing the characteristics of image pickup devices.

FIG. 4 is a diagrammatic view of assistance in explaining a wavelet transform process.

FIGS. 12(A), 12(B), 12(C) and 12(D) are diagrammatic views of assistance in explaining image data provided by the integrated circuit shown in FIG. 11.

FIG. 15 is a plan view of assistance in explaining a data compressing process to be executed by the imaging apparatus shown in FIG. 14.

BEST MODE FOR CARRYING OUT THE INVENTION

Preferred embodiments of the present invention will be described with reference to the accompanying drawings.

(1) Construction of First Embodiment

Figure 5:
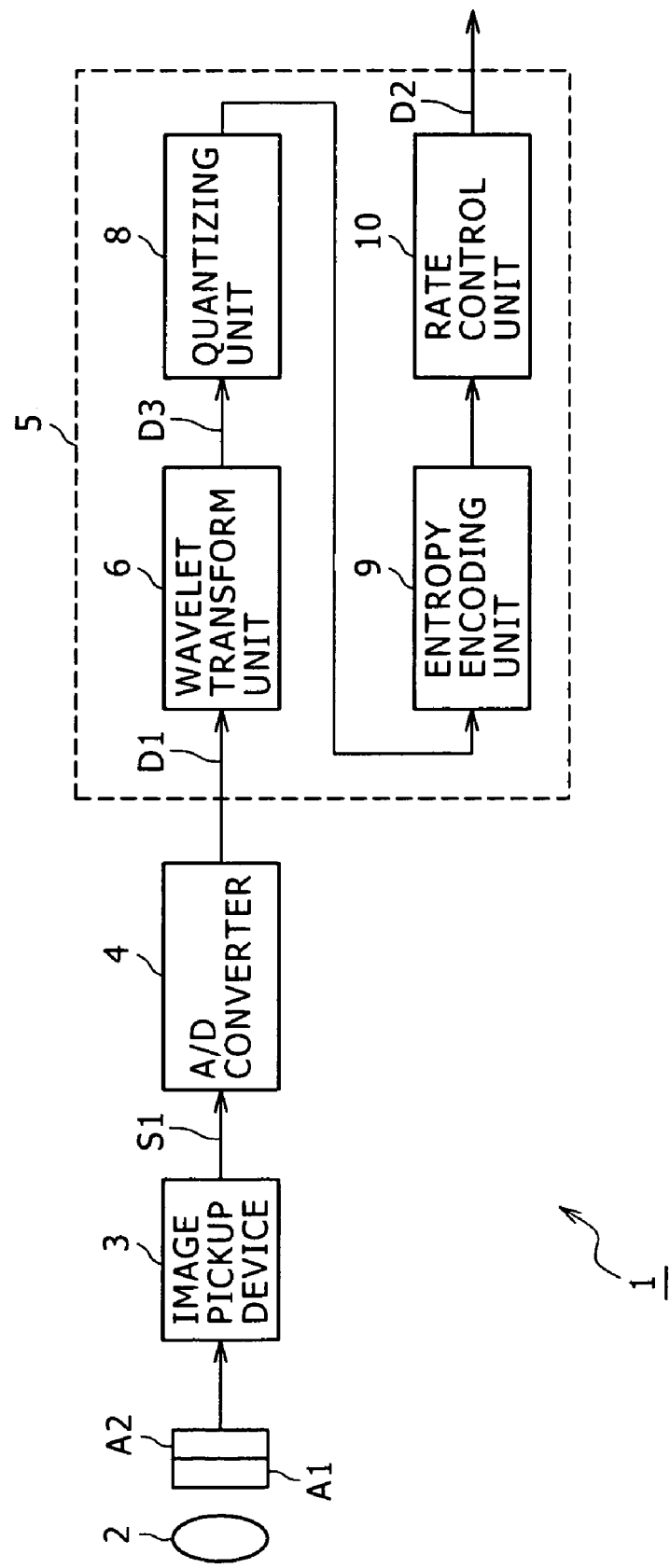
FIG. 5 is a block diagram of an imaging apparatus in a first embodiment according to the present invention.

FIG. 5 is a block diagram of an imaging apparatus in a first embodiment according to the present invention. The imaging apparatus 1 compresses image data representing an image of an object, records the compressed image data on a recording medium and sends the compressed image data to a desired object.

The user operates a lens 2 included in the imaging apparatus 1 for zooming to change magnification and adjusts aperture. Incident light is focused on the imaging surface of an image pickup device 3. An optical low-pass filter A1 attenuates components of spatial frequencies higher than that of light passed through the lens 2. A color correction filter A2 corrects the color temperature of the light passed through the optical low-pass filter A1.

The image pickup device 3 is, for example, a CMOS solid state image pickup device. The image pickup device 3 operates according to timing signals provided by a driver, not shown, to convert an optical image formed on the imaging surface for photoelectric conversion by pixels into an image signal S1. The image pickup device 3 is controlled by a driving circuit, not shown, in an XY address control mode to provide image data provided by the pixels in order corresponding to that used by a coding process to be carried out by a data compressing means at a later stage. In this embodiment, an image compressing device 5 encodes lines of image data by a line-base wavelet transform process and the image pickup device 3 provides lines of image data on pixel lines. Thus, the image data is provided in processing units in which a processing circuit at a lower stage processes the image data. The configuration of a memory circuit to be used for processing the image signal S1 is simplified, which will be described later.

An analog-to-digital converter (A/D converter) 4 converts the analog image signal S1 into a corresponding digital image data D1. The imaging apparatus 1 supplies the image data D1 to the image compressing device 5 after processing the image data D1 by a pixel interpolation process, a color space conversion process, an edge sharpening process and a noise cancellation process.

The image compressing device 5 compresses the image data D1 and processes the compressed image data D1 by a coding process to obtain a coded data D2. The image compressing device 5 supplies the coded data D2 to a recording system and a transmission system. Thus the imaging apparatus 1 stores the coded data D2 in a predetermined recording medium included in the recording system and transmits the coded data D2 through the transmission system to an external device. The image compressing device 5 achieves data compression by a wavelet transform method.

In the image compressing device 5, a wavelet transform unit 6 processes the sequentially received image data D1 by a wavelet transform process and provides transform coefficient data D3 obtained by the wavelet transform process. The wavelet transform unit 6 executes a line-base wavelet transform process that processes lines of image data.

Figure 6:
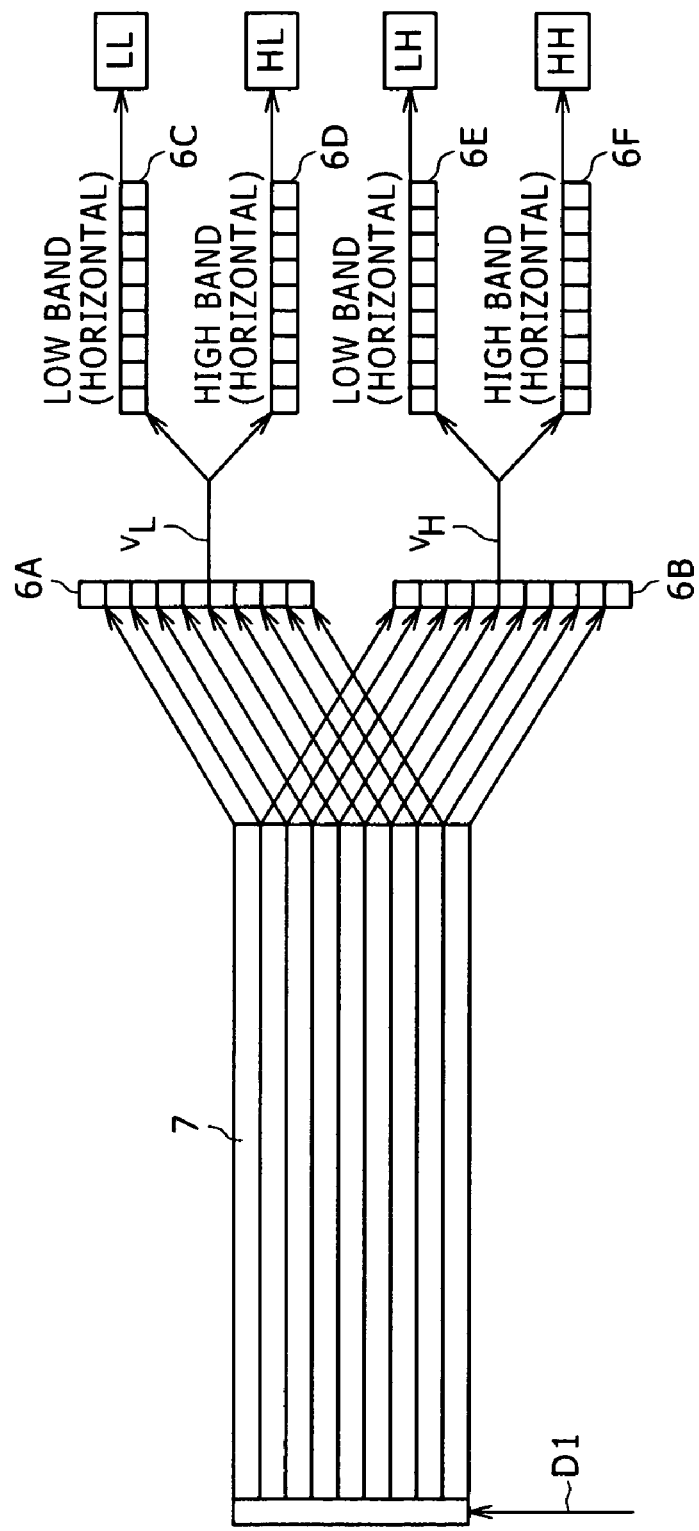
FIG. 6 is a diagrammatic view of assistance in explaining a wavelet transform unit included in the imaging apparatus shown in FIG. 5.

Referring to FIG. 6, the wavelet transform unit 6 divides the image data D1 into two band components VL and VH by a low-pass filter 6A and a high-pass filter 6B each having a predetermined number of vertically arranged taps by a first-stage band division process for band limitation. Then, subbands LL to HH are produced by dividing the band components VL and VH by band division by a low-pass filter 6C, a high-pass filter 6D, a low-pass filter 6E and a high-pass filter 6F each having a predetermined number of horizontally arranged taps. The wavelet transform unit 6 holds the input image data D1 corresponding to the number of taps of the low-pass filter 6A and the high-pass filter 6B at the input stage of the bandwidth division process in a line buffer 7 temporarily, and provides the image data D1 held by the line buffer 7.

Figure 7:
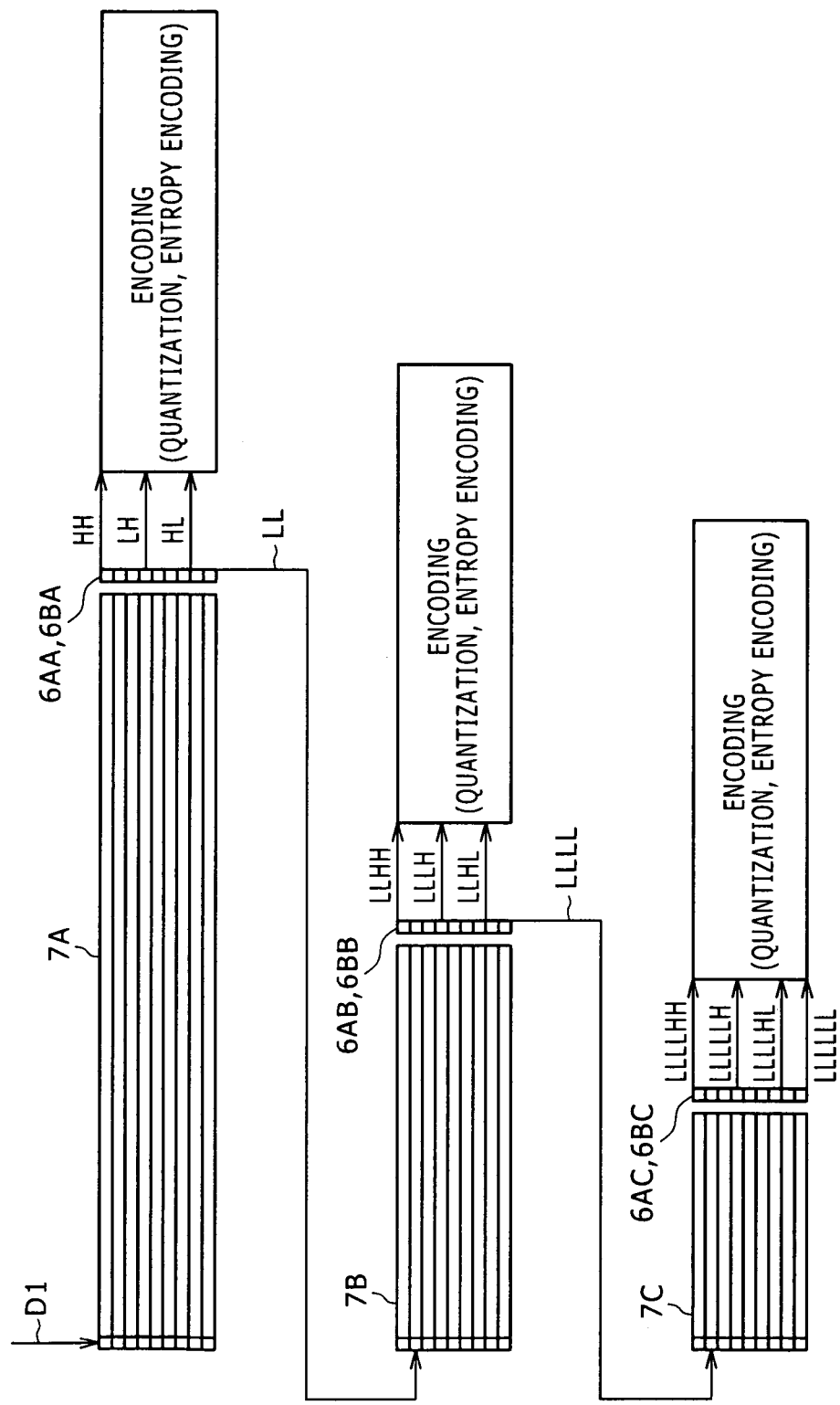
FIG. 7 is a diagrammatic view of assistance in explaining band division to be carried out by the wavelet transform unit of the imaging apparatus shown in FIG. 5.

Referring to FIG. 7, the wavelet transform unit 6 carries out the band division process in three stages. A processing circuit at a lower stage processes the wavelet transform coefficients HH to LLLLLL by band division processes. Line buffers 7A to 7C are assigned to the input stages of the band division processes. The image data provided by the A/D converter 4 is supplied directly to the first line buffer 7A.

Figure 8:
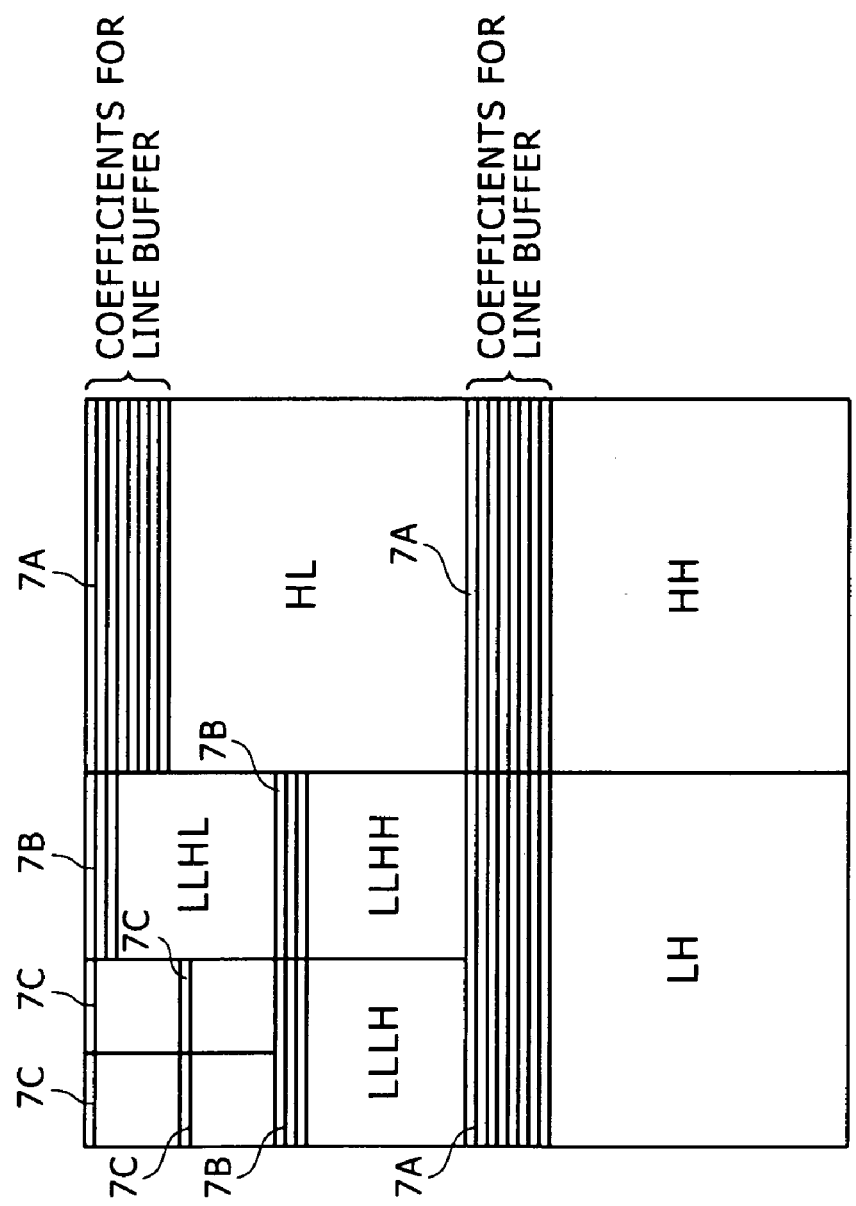
FIG. 8 is a diagrammatic view of assistance in explaining a line buffer coefficient for a process to be carried but by the wavelet transform unit of the imaging apparatus shown in FIG. 5.

Transform coefficient data on the wavelet transform coefficients is accumulated in the line buffers 7A to 7C as shown in FIG. 8 by those processes. When the transform coefficient data is accumulated in the line buffers 7A to 7C after a process for processing a frame of the image data D1 has been started, corresponding coefficient data is provided.

Referring to FIG. 7, the process for processing a frame is started, the image data D1 is supplied in order of lines to the first line buffer 7A, the image data D1 corresponding to the number of taps of the vertical filter subsequent to the line buffer 7A is accumulated. Then, the line buffer 7A starts simultaneous, parallel output of the image data D1 corresponding to the number of taps of the vertical filter in order of the lines. Subsequently, the vertical filters 6AA and 6BA start a vertical band limiting process and a down sampling process in order of the lines. Thus, in the wavelet transform unit 6, the vertical filters 6AA and 6BA provide transform coefficient data relating to vertical band limitation in order of about half the number of lines. The transform coefficient data is supplied to the horizontal low-pass and high-pass filters.

When the coefficient transform data corresponding to the number of the taps of the horizontal low-pass and high-pass filters of the wavelet transform unit 6 is supplied to the horizontal low-pass and high-pass filters, a horizontal band limiting process using the correct transform coefficient data and a down sampling process are started. The band limiting process using the correct transform coefficient data is continued to a sampling number corresponding to the number of taps of the filter at the terminal ends of the lines. Thus the band limiting processes of the first stage for the lines are executed sequentially.

Among the transform coefficient data through the band limiting processes of the first stage, the transform coefficient data LL on the low-frequency side with respect to horizontal and vertical directions is supplied to the line buffer 7B assigned to a second-stage band limiting process. When the transform coefficient data corresponding to the number of taps of the vertical filter subsequent to the line buffer 7B is accumulated, the line buffer 7B starts simultaneous, parallel output of the transform coefficient data. Subsequently, the vertical filters 6AB and 6BB start a band limiting process using the correct transform coefficient data and a down sampling process in order of the lines. Thus, transform coefficient data relating to vertical band limitation is provided in order of about half the number of lines. The transform coefficient data is supplied to the horizontal low-pass and high-pass filters. When the coefficient transform data corresponding to the number of the taps of the horizontal low-pass and high-pass filters of the wavelet transform unit 6 is supplied to the horizontal low-pass and high-pass filters of the second stage, a horizontal band limiting process using the correct transform coefficient data and a down sampling process are started. Thus the band limiting processes of the second stage for the lines are executed sequentially.

Among the transform coefficient data through the band limiting processes of the second stage, the transform coefficient data LLLL on the low-frequency side with respect to horizontal and vertical directions is supplied to the line buffer 7C assigned to a third-stage band limiting process. When the transform coefficient data corresponding to the number of taps of the vertical filter subsequent to the line buffer 7C is accumulated, the line buffer 7C starts simultaneous, parallel output of the transform coefficient data. Subsequently, the vertical filters 6AC and 6BC start a band limiting process using the correct transform coefficient data and a down sampling process in order of the lines. Subsequently, the vertical filters 6AC and 6BC start a band limiting process using the correct transform coefficient data and a down sampling process in order of the lines. Thus, transform coefficient data relating to vertical band limitation is provided in order of about half the number of lines. The transform coefficient data is supplied to the horizontal low-pass and high-pass filters. When the coefficient transform data corresponding to the number of the taps of the horizontal low-pass and high-pass filters is supplied to the horizontal low-pass and high-pass filters of the second stage, a horizontal band limiting process using the correct transform coefficient data and a down sampling process are started. Thus the band limiting processes of the third for the lines are executed sequentially.

The wavelet transform unit 6 of the imaging apparatus in the first embodiment processes the image data line-sequentially. Therefore, the line buffers, namely, memory circuits, on the input side of the band division processes may be those of a small capacity and the construction of the imaging apparatus is simple.

A quantizing unit 8 quantizes transform coefficient data D3 sequentially and supplies quantized data to an entropy encoding unit 9. The entropy encoding unit 9 processes the output data of the quantizing unit 8 by an entropy encoding process sequentially. A rate control unit 10 processes the output of the entropy encoding unit 9 by rate control process and provides coded data D2. The quantizing unit 8 and the entropy encoding unit 9 process the coefficient data D3 provided by the wavelet transform unit 6 sequentially in synchronism with the output of the coefficient data accumulated in the buffers 7A to 7C. Thus the quantizing unit 8 and the entropy encoding unit 9 processes the data line-sequentially. Therefore, the quantizing unit 8 and the entropy encoding unit 9 are simple in configuration. The image compressing device 5 thus compresses the image data D1 line-sequentially. The image pickup device 3 provides image data line-sequentially according to the line-sequential operation of the image compressing unit 8 and provides the image data on each line in processing order in which the image compressing device 5 processes the image data. Thus the image data D1 provided by the A/D converter 4 is supplied directly to the image compressing device 5 to simplify the construction of the imaging apparatus.

Figure 9:
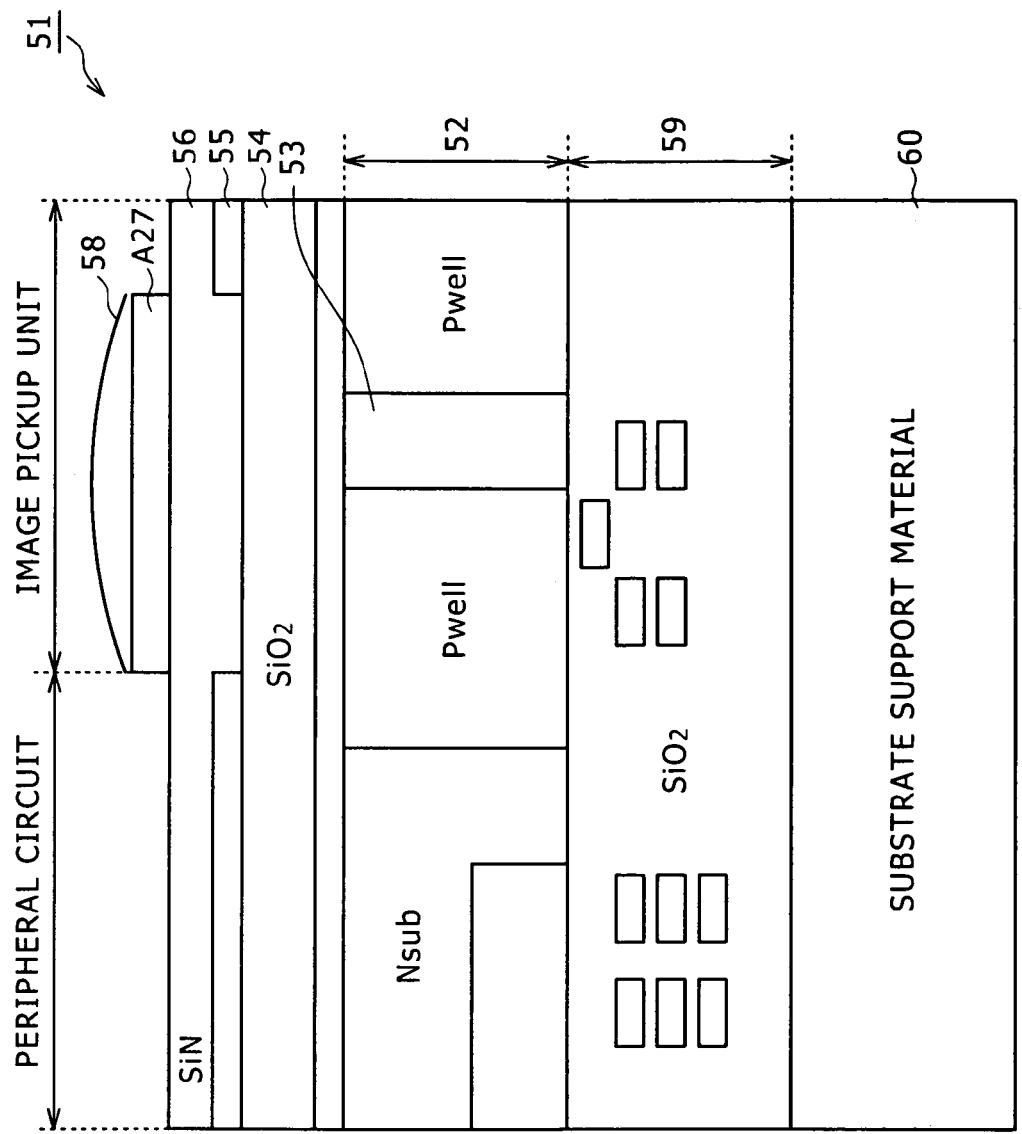
FIG. 9 is a sectional view of an integrated circuit included in the imaging apparatus shown in FIG. 5.

FIG. 9 is a sectional view of a part of an integrated circuit 51 included in the imaging apparatus 1. The integrated circuit 51 is formed by integrally combining the image pickup device 3 and a peripheral circuit. In this embodiment, the peripheral circuit includes a driving circuit for driving the image pickup device 3, the A/D converter 4 and the image compressing device 5. Thus the construction of the imaging apparatus in this embodiment can be simplified.

In the integrated circuit 51, pixels are arranged in a matrix to form an image pickup module included in the image pickup device 3. The peripheral circuit is formed around the image pickup module. FIG. 9 is a sectional view showing part of the image pickup module and the peripheral circuit.

The integrated circuit 51 has a device layer 52, namely, a silicon (Si) layer of a thickness between about 10 and about 20 μm. Photodiodes 53 for photoelectric conversion are formed in parts respectively corresponding to pixels of the device layer 52. Devices, such as MOSFETs, of the peripheral circuit are formed in a layer underlying the device layer 52.

In the integrated circuit 51, a silicon dioxide film ($SiO_2$ film) 54, a shading film 55, a silicon nitride film (SiN film) 56, a color filter A27 and microlenses 58 are stacked in that order on the device layer 52. The photodiodes 53 and a wiring layer 59 for connecting the circuit devices of the peripheral circuit are formed under the device layer 52. The wiring layer 59 is formed on a substrate support 60. In the integrated circuit 51, the wiring layer 59 is formed on a surface opposite a light-receiving surface. Thus all the troubles resulting from forming the wiring layer on the light-receiving surface are eliminated and the degree of freedom of wiring is increased. The troubles resulting from forming the wiring layer on the light-receiving surface are the reduction of the intensity of light falling on the pixels by the shading effect of the wiring lines of the wiring layer and crosstalk between the adjacent pixels.

When the wiring layer 59 of the integrated circuit 51 is formed on the surface opposite the light-receiving surface, the photodiodes 53 and the circuit devices of the peripheral circuit are formed in a thin semiconductor substrate, the wiring layer 59 is formed on the semiconductor substrate, and then the substrate support 60 is attached to the semiconductor substrate. Then, the semiconductor substrate is turned over and the surface of the semiconductor substrate is polished by CMP to complete the device layer 52. Then, the shading film 55, the silicon nitride film (SiN film) 56, the color filters A27 and the microlenses 58 are formed sequentially.

Thus the image pickup device 3 and the peripheral circuit of the imaging apparatus 1 are combined integrally in the integrated circuit, and the wiring layer is formed on the surface opposite the light-receiving surface. The wiring lines are arranged by effectively utilizing the greatly increased degree of freedom of wiring so that the image data provided by the image pickup device 3 can be processed in a line-sequential mode for the data compressing process and in order for the data compressing process.

(2) Operation of First Embodiment

The lens 2 of the imaging apparatus 1 forms an image of an object on the imaging surface of the image pickup device 3 and the image pickup device 3 provides image data on the image. Then, the A/D converter 4 converts the image data into the image data D1. The image data D1 is processed by the edge sharpening process, the image compressing device 5 compresses the image data D1 to convert the image data D1 into the coded data D2. The coded data D2 is recorded on the recording medium and is transmitted to the external device. Thus the imaging apparatus 1 compresses the image data, records the compressed image data and sends out the compressed image data.

In this series of processes, the image compressing device 5 processes the image data D1 by the wavelet transform process and provides the wavelet transform coefficient data D3. The wavelet transform coefficient data D3 is processed by the quantizing process, the entropy encoding process and the rate control process to provide the coded data D2. The image pickup device 3 provides image signals S1 representing the image data sequentially in processing units. The image data D1 provided by the A/D converter 4 can be directly supplied to the image compressing device 5 for data compression. Thus the construction can be simplified.

Image data is read by XY address control from the image pickup device 3, namely, the CMOS solid state image pickup device, at a high degree of freedom of reading. Therefore, the image data can be read in various image data reading modes, such as a line-sequential reading mode, a column-sequential reading mode and a block-sequential reading mode. This embodiment reads the image data from the image pickup device 3 in processing units in which the image data is processed by the image compressing device 5. The construction is further simplified by effectively utilizing the high degree of freedom of reading characterizing the CMOS solid state image pickup device.

More concretely, in the imaging apparatus 1, the processing units in which the image compressing device 5 processes the image data are lines and the lines of the image data are compressed by a line-base wavelet transform process, the image pickup device 3 provides the lines of image data. Thus the construction is simplified by effectively utilizing the high degree of freedom of reading.

In the imaging apparatus 1, the image pickup device 3 that provides the image data in the foregoing mode, the image compressing device 5, namely, a peripheral circuit for processing the image data, and the A/D converter 4 are integrated in an integrated circuit. Thus the construction is miniaturized and simplified.

If the image pickup device and the peripheral circuit are integrated simply by a CMOS structure, a wiring pattern connecting the image pickup device and the peripheral circuit causes various troubles and the high degree of freedom of reading the image data cannot be fully utilized. Therefore, the wiring layer is formed on the surface opposite the light-receiving surface of the image pickup means in this embodiment and the photoelectric converters of the image pickup means are connected to the peripheral circuit by the wiring layer. The integrated circuit thus formed ensures the high degree of freedom of reading the image data, and the construction is simplified by effectively utilizing the high degree of freedom of reading the image data.

(3) Effect of First Embodiment

The image pickup means and the image compressing means are connected by the wiring layer formed on the surface opposite the light-receiving surface of the image pickup means to build the integrated circuit and the image pickup means provides the image data sequentially in the processing units in which the image data is processed by the image compressing process. Thus the construction can be further simplified by effectively utilizing the high degree of freedom of reading the image data characterizing the CMOS solid state image pickup device.

The image data is compressed line-sequentially by the wavelet transform process and the image pickup device provides the image data provided by the plurality of photoelectric converters line sequentially. Thus the construction can be further simplified by effectively utilizing the high degree of freedom of reading the image data characterizing the CMOS solid state image pickup device.

(4) Second Embodiment

An imaging apparatus in a second embodiment according to the present invention uses a tile-base wavelet transform process instead of the line-base wavelet transform process used by the imaging apparatus 1 in the first embodiment for data compression. The imaging apparatus in the second embodiment is the same in configuration as the imaging apparatus 1 in the first embodiment, excluding a wavelet transform unit 6 and arrangement relating to the wavelet transform unit 6. The imaging apparatus in the second embodiment will be described in connection with FIG. 5 and the description of parts of the imaging apparatus in the second embodiment like or corresponding to those of the imaging apparatus 1 in the first embodiment will be omitted to avoid duplication.

Figure 10:
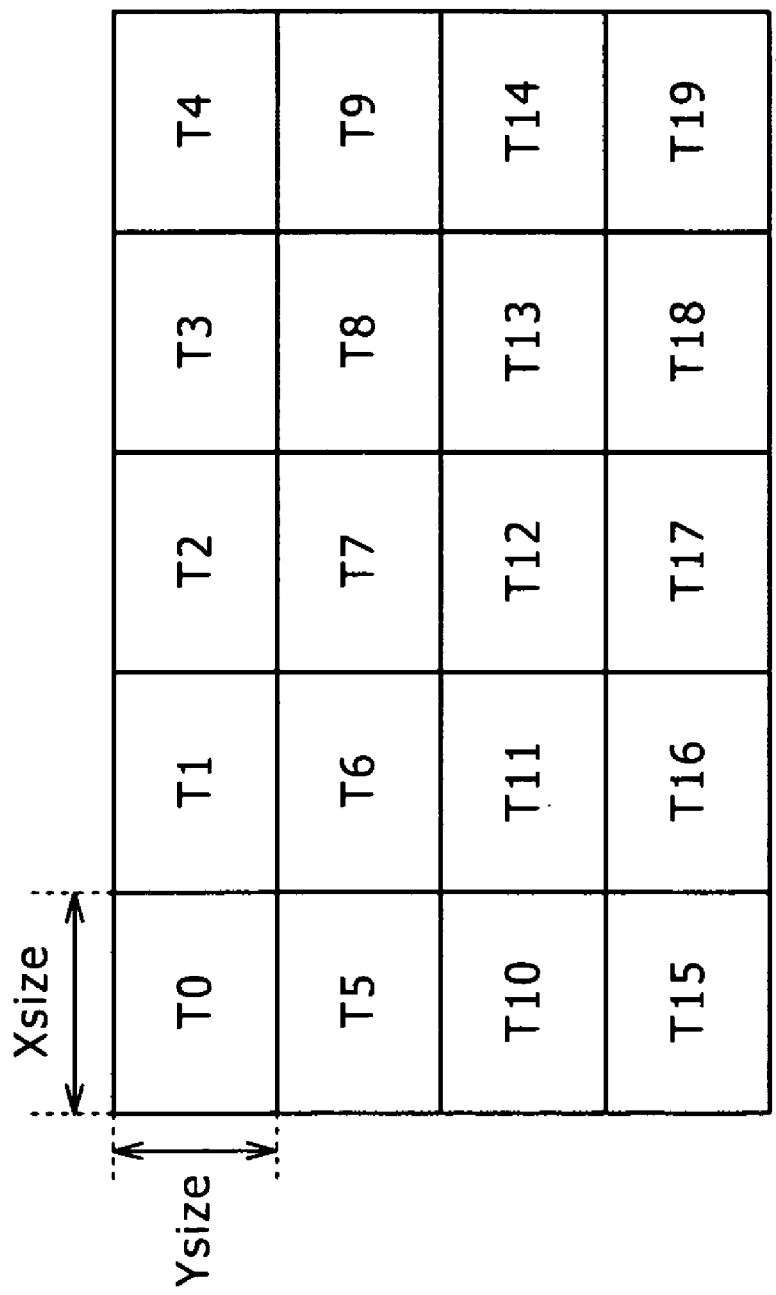
FIG. 10 is a diagrammatic view of assistance in explaining a wavelet transform unit included in an imaging apparatus in a second embodiment according to the present invention.

Image data D1 on an image obtained by the imaging apparatus is divided by a predetermined number of horizontal lines and a predetermined number of vertical lines to demarcate tiles T0, T1, T2, . . . , namely, blocks as processing units, as shown in FIG. 10. The wavelet transform unit 6 included in the imaging apparatus in the second embodiment reads the tiles T0, T1, T2, . . . of the image data D1 sequentially in a raster scanning mode and processes the tiles T0, T1, T2, . . . of the image data D1 by a wavelet transform process. A quantizing unit 8 quantizes tiles of transform coefficient data provided sequentially by the wavelet transform unit 6 sequentially. An entropy encoding unit 9 processes the tiles of the quantized data sequentially provided by the quantizing unit 8 by an entropy encoding process. A rate control unit 10 provides the output of the entropy encoding unit 9 through rate control.

The tile-base wavelet transform process is achieved through band limitation and down sampling with a two-dimensional filter. The capacity of buffer memories of the tile-base wavelet transform process at the input stage of division processing may be small as compared with that of the line-base wavelet transform process.

The image compressing device 5 of this imaging apparatus executes a tile-base data compressing process and a driving circuit not shown, controls the image pickup device 3 by rate control to provide the image data from the photoelectric converters in a tile-sequential mode.

Even though the image pickup means and the image compressing means of the imaging apparatus in the second embodiment are connected to form an integrated circuit by a wiring layer formed on a surface opposite a light-receiving surface of the image pickup means, the image data is provided sequentially in processing units for the image compressing process by the image pickup means, the image compressing means processes the tiles of the image data by a wavelet transform process to compress the image data, the image pickup means provides the tiles of the image data and the tiles of the image data are processed, the construction can be further simplified by utilizing the high degree of freedom of reading the image data characterizing the image pickup device, such as a CMOS solid state image pickup device.

(5) Third Embodiment

Figure 11:
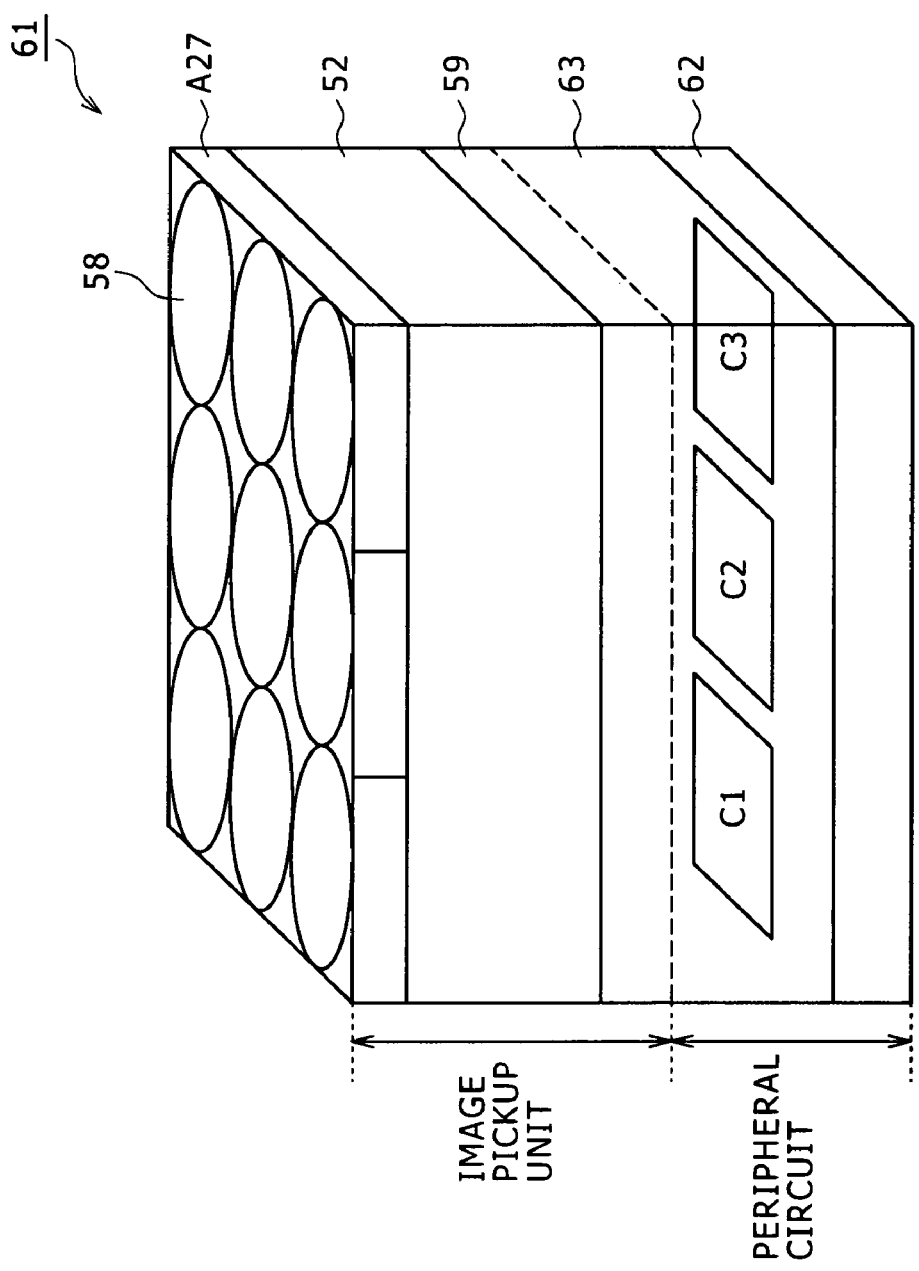
FIG. 11 is a fragmentary perspective view of an integrated circuit applied to an imaging apparatus in a third embodiment according to the present invention.

FIG. 11 is a fragmentary perspective view of an integrated circuit 61 included in an imaging apparatus in a third embodiment according to the present invention. In the third embodiment, this integrated circuit 61 constitutes the imaging apparatus in the first and the second embodiment. Parts of the integrated circuit 61 like or corresponding to those of the integrated circuit 51 of the first embodiment are designated by the same reference characters and the description thereof will be omitted to avoid duplication.

The integrated circuit 61 integrally includes an image pickup device 3 and a peripheral circuit. The peripheral circuit is the same as the peripheral circuits of the first and the second embodiment. Thus construction of the imaging apparatus in the third embodiment is simple.

The integrated circuit 61 is formed by stacking up a peripheral circuit and an image pickup device. The peripheral circuit is fabricated by forming the component semiconductor devices of the peripheral circuit on a semiconductor substrate 62 by predetermined semiconductor device fabricating processes and forming a wiring layer 63 over the semiconductor devices and connecting the wiring layer 63 to the semiconductor devices. The peripheral circuit is provided on its surface with electrodes and such to be connected to the image pickup unit.

As mentioned in connection with the first embodiment, the image pickup device has an image pickup layer 52 including photoelectric converters, namely, pixels, arranged in a matrix. The image pickup layer 52 is a silicon layer (Si layer) of a thickness between about 10 and about 20 μm. The image pickup device has photodiodes formed in the image pickup layer 52 to carry out a photoelectric conversion process.

A silicon dioxide film, a shading film, a silicon nitride film, a color filter A27 and microlenses 58 are stacked in that order on the upper surface of the image pickup layer 52 of the image pickup device to form an image pickup unit. A wiring layer 59 is formed on the lower surface of the image pickup layer 52. A wiring layer 63 included in the peripheral circuit is formed on the lower surface of the wiring layer 59. The wiring layers 59 and 63 are connected to form the integrated circuit 61 including the image pickup device and the peripheral circuit.

The wiring layer 59 of the integrated circuit 61 is formed on a surface opposite a light-receiving surface. Thus all the troubles resulting from forming the wiring layer 59 on the light-receiving surface are eliminated and the degree of freedom of wiring is increased greatly. The peripheral circuit and the image pickup device separately formed by different wafer processing processes can be integrally combined by the wiring layer 59. Since the image pickup device and the peripheral circuit can be separately formed by suitable wafer processing processes, respectively, various abilities of the imaging apparatus can be generally improved.

The semiconductor devices are miniaturized and lines of the wiring pattern are narrowed to arrange the semiconductor devices in a high density to form the peripheral circuit in a small chip and to reduce power consumption. If the pixel size of the pixels of the image pickup device is reduced, the sensitivity of the image pickup device decreases accordingly. The area of the chip increases with the increase of the number of pixels. When the image pickup device and the peripheral circuit are thus fabricated separately by different wafer processing processes and are combined together in the integrated circuit, the image pickup device and the peripheral circuit can be fabricated by suitable wafer processing processes, respectively, and the ability can be improved accordingly.

When integrated circuit 61 is built by integrally combining the image pickup device and the peripheral circuit by the wiring layer 59 formed on the surface opposite the light receiving surface, the integrated circuit 61 can be formed, similarly to the integrated circuit of the first embodiment, by forming photodiodes by processing a surface on the side of the wiring layer 59 of a thin semiconductor substrate, forming the wiring layer 59 on the semiconductor substrate, and the peripheral circuit formed by separate processes is attached to the semiconductor substrate. Then, the semiconductor substrate is turned over and the surface of the semiconductor substrate is polished by CMP to complete the device layer 52. Then, the shading film, the color filter A27, and the microlenses 58 are formed sequentially.

The image pickup device and the peripheral circuit of the integrated circuit 61 thus formed by stacking up the component layers can be connected such that the pixels of the integrated circuit 61 supply output signals in a simultaneous, parallel output mode to the peripheral circuit as shown in FIG. 12(A) and the image data is processed by an A/D conversion process. Columns of the image data can be provided in a simultaneous, parallel output mode as shown in FIG. 12(B) and the columns of the image data can be processed by the peripheral circuit. Lines of the image data can be provided in a simultaneous, parallel output mode as shown in FIG. 12(C) and the lines of the image data can be processed by the peripheral circuit. The flexibility of the image data output mode improves the degree of freedom of output of the image pickup device remarkably.

Figure 2:
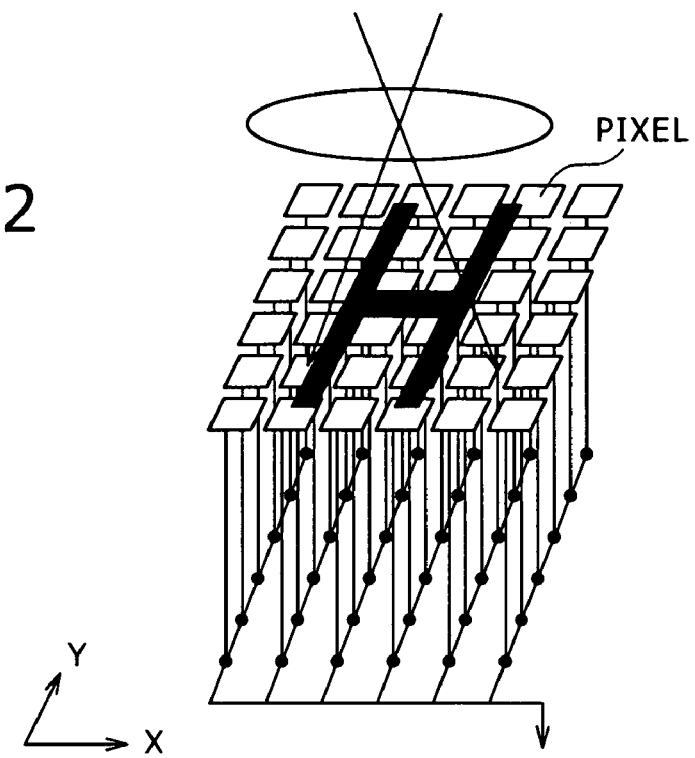
FIG. 2 is a typical view showing the output of a CCD solid state image pickup device.
Figure 3:
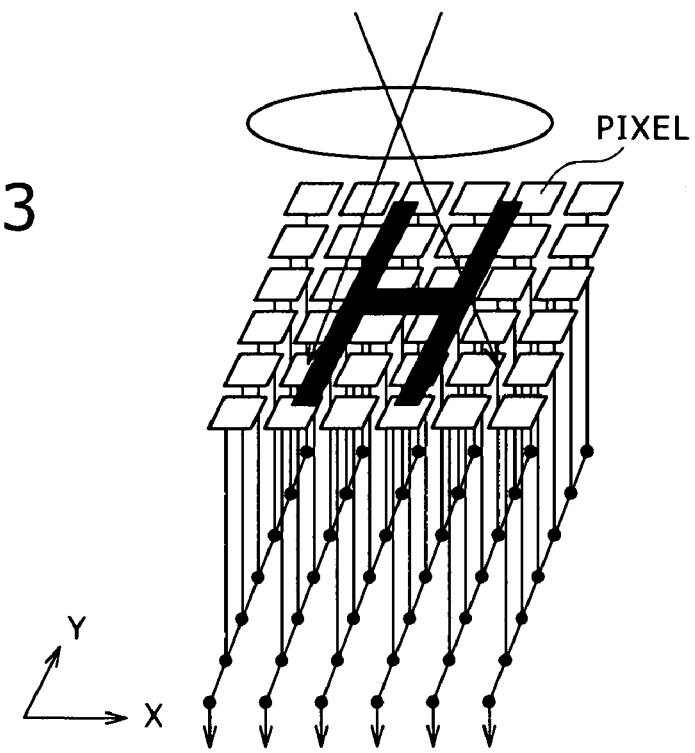
FIG. 3 is a typical view showing the output of a CMOS solid state image pickup device.

Signal lines are connected to the pixels, respectively. The image data can be provided in various output modes through the XY address control of the pixels. For example, the image data can be provided in the simultaneous, parallel output mode shown in FIG. 12(A) by simultaneously turning on MOSFETs included respectively in the pixels, the lines of the image data can be provided as mentioned above in connection with FIG. 3 by controlling the horizontal address lines, and the image data successively arranged on vertical lines can be provided as will be mentioned later with reference to FIG. 12(C) by controlling the vertical address lines. In the output mode shown in FIG. 12(C), the image data can be provided from the vertically successively arranged pixels by controlling the vertical address lines instead of controlling the horizontal address lines as mentioned with reference to FIG. 3, and assigning each signal line sequentially to the horizontally arranged pixels in a times sharing mode. In an output mode shown in FIG. 12(D), the image data can be provided in various sequences by sequentially selecting a plurality of pixels included in a block and connected to a signal line in raster scanning mode and a zigzag scanning mode through the control of the vertical and the horizontal address line. The pixels are arranged successively in horizontal and vertical directions on the horizontal and the vertical address lines. The pixels of the plurality of blocks are scanned in the same scanning order.

Figure 13C:
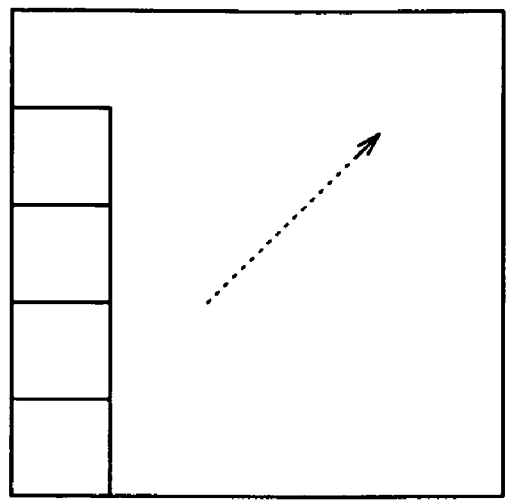
FIGS. 13(A), 13(b) and 13(C) are diagrammatic views of assistance in explaining order in which the integrated circuit shown in FIG. 11 provides image data.
Figure 13B:
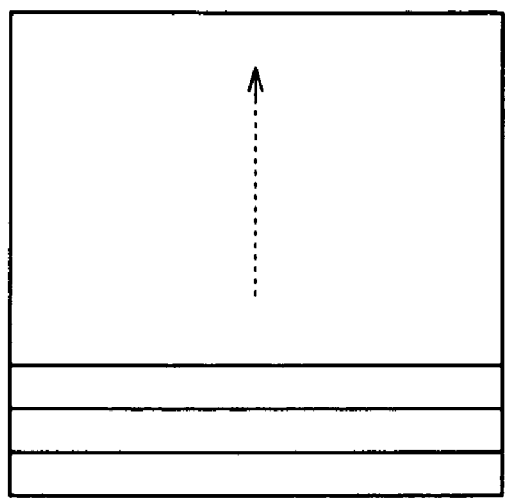
Figure 13A:
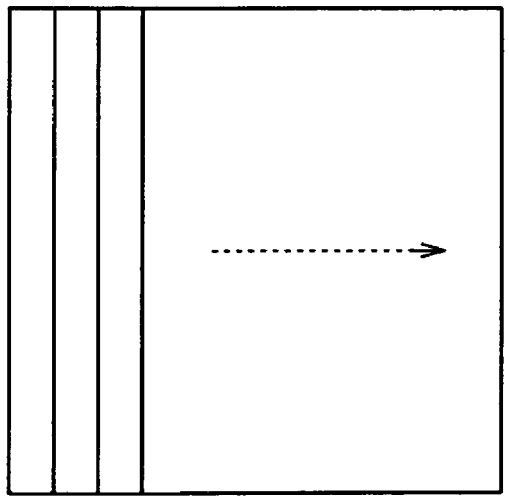

The image pickup device and the peripheral circuit of the integrated circuit 61 can be connected so as to provide the image data in a line-sequential output mode as shown in FIG. 13(A), in a column-sequential output mode as shown in FIG. 13(B) or in a block-sequential output mode as shown in FIG. 13(C).

The imaging apparatus in the first embodiment processes the image data by the line-sequential process. The imaging apparatus in the third embodiment supplies the image data to the peripheral circuit in one of the output modes shown in FIGS. 12(A) to 12(D).

The integrated circuit 61 of the imaging apparatus in the third embodiment supplies the image data to the peripheral circuit in a simultaneous, parallel output mode through a plurality of systems. The image compressing device 8, namely, the peripheral circuit, of the integrated circuit 61 includes three processing circuits C1 to C3 as shown in FIG. 11. Those three processing circuits C1 to C3 process the image data supplied thereto through the three systems in a simultaneous, parallel processing mode.

The peripheral circuit and the image pickup means of the imaging apparatus in the third embodiment are formed separately by different, suitable wafer processing processes, respectively. Consequently, various abilities can be improved.

(6) Fourth Embodiment

Figure 14:
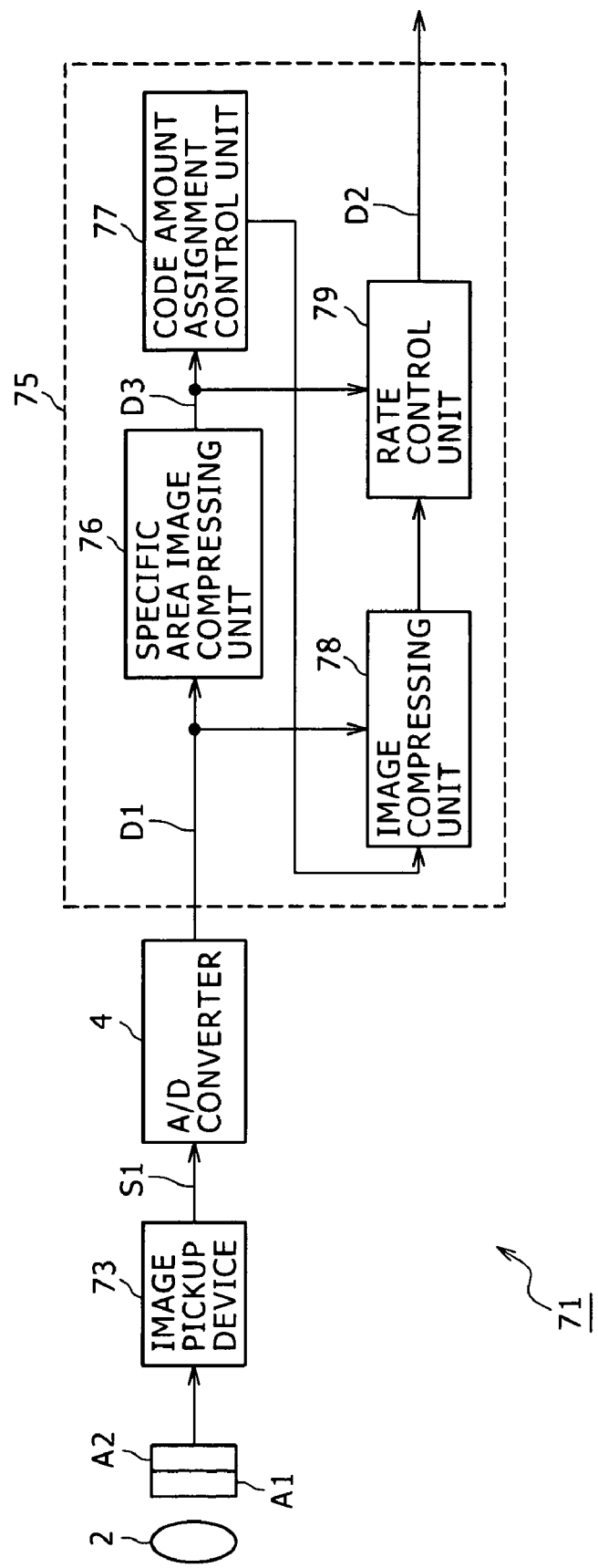
FIG. 14 is a block diagram of an imaging apparatus in a fourth embodiment according to the present invention.

FIG. 14 is a block diagram showing an imaging apparatus 71 in a fourth embodiment according to the present invention in comparison with the imaging apparatus 1 shown in FIG. 5. Parts of the imaging apparatus 71 shown in FIG. 14 like or corresponding to those of the imaging apparatus 1 shown in FIG. 5 are designated by the same reference characters and the description thereof will be omitted to avoid duplication. The imaging apparatus 71 includes an integrated circuit similar to that of the first or the third embodiment. The integrated circuit of the imaging apparatus 71 is formed by integrally combining a driving circuit for driving an image pickup device 73, an A/D converter 4 and an image compressing device 75, namely, a peripheral circuit. Image data can be supplied in various output modes to the peripheral circuit. Thus the construction is simple and small.

The image pickup device 73 is a CMOS solid state image pickup device. The driving circuit, not shown, drives the image pickup device 73. Referring to FIG. 15, the image pickup device 73 outputs successively an image signal S1 representing an image formed in an effective image area AR in processing units in which the image compressing device 75 process image data. The driving circuit, not shown, controls the image pickup device 73 by XY address control such that the image pickup device 73 provides image data of partial images formed in partial areas ARA to ARE in advance. The partial areas ARA to ARE are rectangular areas. The partial area ARC is at the center of the effective image area ARA and the four partial areas ARA, ARB, ARD and ARE are at the four corners, respectively, of the effective image area AR. Compressing process necessary for compressing the image data of the image formed in the effective image area AR can be roughly gripped from the partial areas ARA to ARE in the effective image area AR.

The image compressing device 75 detects a code amount by compressing the image data of partial images formed in the partial areas ARA to ARE. The image compressing device 75 compresses the image data provided by the image pickup device 73 at a data compressing ratio based on the detected code amount. A specific area image compressing unit 76 included in the image compressing device 75 compresses image data D1 on images in the partial areas ARA to ARE, supplies a signal indicating the code amount of codes produced by compressing the image data D1 to a code amount assignment control unit 77. The code amount assignment control unit 77 estimates the code amount of codes that may be produced when the image on the effective image area AR is compressed on the basis of the code amount indicated by the received signal and determines a data compressing ratio on the basis of the estimated code amount. The specific area image compressing unit 76 compresses tiles corresponding to the partial areas ARA to ARE as processing units by a wavelet transform process or compresses the partial areas ARA to ARE as one or a plurality of macroblocks by a MPEG2 method. The data may be compressed by any one of various compressing methods.

An image compressing unit 78 determines a quantization scale according to the data compressing ratio determined by the code amount assignment control unit 77, compresses the image data D1 on the image in the effective image area AR and provides compressed image data. A rate control unit 79 inserts dummy data into the image compressing unit 78 for a rate control process and provides coded data D2. The image compressing unit 78 compresses the image data by a data compressing method used by the specific area image compressing unit 76. When rate control can be practically satisfactorily achieved, the image compressing unit 78 may compress the image data by a data compressing method different from that used by the specific area image compressing unit 76.

Thus the imaging apparatus in the fourth embodiment detects the code amount of codes produced by compressing the image data on images in the partial areas in the effective image area by effectively utilizing the high degree of freedom of reading image data of the image pickup device, namely, the CMOS solid state image pickup device, and determines the data compressing ratio on the basis of the code amount and compresses the image data on the overall image at this data compressing ratio. Thus the imaging apparatus determines the data compressing ratio properly and executes rate control more properly than the conventional imaging apparatus.

Suppose that the code amount of codes produced by compressing the image data on the partial areas is TS and a desired code amount of the overall image is TALL. Then a code amount TE that can be assigned to the rest of the areas can be expressed by TALL−TS. Suppose that a code amount of codes that may be produced by compressing the data in the rest of the areas is TR, a surplus code amount $TE_{xta}=(TR+TS)-TALL$. The data compressing process can use a desired code amount for data compression by determining the data compressing ratio so as to distribute the surplus code amount $TE_{xta}$ to all. The code amount TR of codes that are produced by compressing the rest of areas can be estimated from the code amount TS of codes that are produced by data compression that is executed in advance and hence the data compressing process can be properly carried out.

The code amount assignment control unit 77 and the rate control unit 79 determine the data compressing ratio according to the code amount determined by the advance coding process and caries out the rate control process.

The imaging apparatus in the fourth embodiment detects the code amounts of codes produced by processing the image data on images in the partial areas of the effective image area by the data compressing process in advance, determines the data compressing ratio according to the code amount and processes the image data by the data compressing process. Thus the imaging apparatus in the fourth embodiment can carry out rate control more properly than the conventional imaging apparatus by a process simpler than the conventional process by effectively utilizing the high degree of freedom of reading image data characterizing the CMOS solid state image pickup device.

When rate control can be achieved practically satisfactorily through the application of data compression of the image data at the data compressing ratio based on the previously detected code amount to the compression of the image data on the image on the effective image area, the image data can be compressed by a data compressing method different from the data compressing method relating to the advance process. Thus various data compressing methods can be used for data compression.

Concretely, rate control can be achieved by a simple process by applying a quantization scale corresponding to the data compressing ratio to the quantization of the coefficient data.

When rate control can be carried out practically satisfactorily by compressing the image data of the image in the effective image area in addition to the data compression relating to the advance process, the image data can be compressed by a data compressing method different from the data compressing method relating to the advance process. Thus various data compressing methods can be used for data compression.

The image data can be compressed by a data compressing method different from that relating to the advance process when the imaging apparatus is provided with a data compressing means relating to the advance process an a data compressing means using the data compressing ratio relating to the advance process. Thus various data compressing method can be used.

The image pickup means and the peripheral circuit underlying the wiring layer formed on the surface opposite the light-receiving surface of the image pickup means are connected by the wiring layer. Therefore, the image data can be supplied from the image pickup means to the peripheral circuit so as to be properly processed by the series of processes even in a case where the coding process is carried out after receiving the image data on images on the partial areas from the image pickup means in advance and detecting the code amount.

Since the image pickup means and the peripheral circuit formed separately by wafer processing processes, respectively, the image pickup device and the peripheral circuit can be formed by suitable wafer processing processes, respectively, and various abilities of the imaging apparatus can be generally improved.

(7) Fifth Embodiment

An imaging apparatus in a fifth embodiment according to the present invention is similar to the imaging apparatus in the fourth embodiment. The imaging apparatus in the fifth embodiment carries out a rate control process by controlling a code amount relating to the rest of the areas by a code amount detected by an advance data compressing process. An image pickup device 73 provides image data on the image in the effective image area AR excluding the partial areas ARA to ARE after the advance data compressing process. A code amount assignment control unit 77 controls a quantization scale relating to the data compressing process to be carried out by the image compressing unit 78 for the image data on an image in the effective image area AR excluding the partial areas ARA to ARE. The imaging apparatus provides coded data obtained by the advance data compressing process together with coded data obtained by the data compressing process carried out by the image compressing unit 78.

Quantization scale for a specific area image compressing unit 76 relating to the advance process is controlled by a code amount of codes produced by a data compressing process for compressing the image data of the image in the effective image area AR excluding the partial areas ARA to ARE. Thus, in this embodiment, the specific area image compressing unit 76 and the image compressing unit 78 compresses the image data D1 by the same method.

The imaging apparatus in the fifth embodiment is identical with the imaging apparatus in the fourth embodiment, except that the constitution of the imaging apparatus in the fifth embodiment relating to processing the image data D1 is different from that of the imaging apparatus in the fourth embodiment.

The imaging apparatus in the fifth embodiment can exercise the same effect as the imaging apparatus in the fourth embodiment by applying detecting the code amount in advance by compressing image data on images in the partial areas in the effective image area, determining the data compressing ratio according to the detected code amount and compressing the image data at the thus determined data compressing ratio to the compression of the image data on the image in the area excluding the partial areas relating to the advance process.

(8) Sixth Embodiment

The construction of an imaging apparatus in a sixth embodiment according to the present invention is similar to that of the imaging apparatus in the fourth or the fifth embodiment. The imaging apparatus in the sixth embodiment changes the partial areas relating to the advance process according to an image pickup mode selected by the user. The constitution of the imaging apparatus in the sixth embodiment is the same as that of the imaging apparatus in the fourth or the fifth embodiment excluding the process relating to the partial areas relating to the advance process.

The imaging apparatus in the sixth embodiment selects the most important areas for an image pickup mode selected by the user as areas for previous code amount detection. Data compressing ratio relating to the compression of the image data on the image in the effective image area using the previously detected code amount is changed properly according to the image pickup mode so that the code amount is distributed properly to parts on the basis of the most important areas.

When the user selects a portrait mode, image data on persons is important and, in most cases, an image of persons is formed in a central area of the effective image area. Thus an area from which a code amount is detected beforehand is a central area of the effective image area when a portrait mode is selected. In a portrait mode, image data on the foreground and the background of persons is not important as compared with the image data on persons. Therefore, a data compressing ratio relating to the compression of the image data on an image in the effective image area is determined on the basis of the code amount detected in advance such that the amount of codes assigned to the central area of the effective image area is larger than that assigned to the peripheral area of the effective image area.

When the user selects a scenery mode, image data on the substantially entire effective image area is important. Thus, as mentioned above in connection with FIG. 15, a central area and a plurality of peripheral areas are used as areas from which a code amount is detected beforehand when a scenery mode is selected. In a scenery mode, a data compressing ratio relating to the compression of the image data on an image in the effective image area is determined on the basis of the code amount detected in advance such that compression ratios at which partial images in the entire effective image area are substantially equal.

In the imaging apparatus in the sixth embodiment, a system controller, namely, an arithmetic processing means for generally controlling operations of the imaging apparatus, controls the image data provided by the image pickup device 3 and operations of the image compressing means according to a photographing mode selected by the user to carry out the series of processes.

Thus further proper rate control can be achieved by changing the data compressing ratio determined on the basis of the code amount detected beforehand according to the photographing mode and changing the area from which the code amount is detected in advance according to the photographing mode.

(9) Seventh Embodiment

An imaging apparatus in a seventh embodiment according to the present invention determines the most important partial area for a selected photographing mode in the sixth embodiment automatically on the basis of color distribution in an image according to the photographing mode. The construction of the imaging apparatus in the seventh embodiment is identical with that of the imaging apparatus in the sixth embodiment, except that the imaging apparatus in the seventh embodiment determines the most important partial area for a selected photographing mode by an automatic process.

In the imaging apparatus in the seventh embodiment, a part of a skin color in an image in a preceding frame is detected when the user selects a portrait mode, a partial area relating to advance data compressing process is determined so as to include the part of skin color or so as to be contained in the part of skin color.

When the user selects a close-up mode, an area of a warm color hue in an image in a preceding frame is detected and a partial area relating to advance data compressing process is determined so as to include the part of the warm color hue or so as to be contained in the part of the warm color hue.

When an area for the advance detection of a code amount on the basis of color distribution in an image, further proper rate control can be achieved.

Further proper rate control can be achieved by changing the area according to a selected photographing mode.

(10) Modifications

Although the fourth to the seventh embodiment carries out the advance data compressing process by a specific processing system, the advance data compressing process may be carried out by the original data compressing system.

Although the image pickup means of each of the foregoing embodiments is a CMOS image pickup device, various image pickup devices capable of XY address control may be employed.

INDUSTRIAL APPLICABILITY

The present invention is applicable to video cameras capable of recording moving pictures, electronic still cameras, monitoring devices and such.

REFERENCE CHARACTERS 1, 71 . . . Imaging apparatuses
2 . . . Lens
3, 73 . . . Image pickup devices
4 . . . . Analog-to-digital converter
5, 75, 78 . . . Image compressing units
6 . . . Wavelet transform unit
6A, 6C, 6E . . . Low-pass filters
6B, 6D, 6F . . . High-pass filters
6AA, 6AB, 6AC, 6BA, 6BB, 6BC . . . Vertical filters
7, 7A to 7C . . . Line buffers
8 . . . Quantizing unit
9 . . . Entropy encoding unit
10, 79 . . . rate control units
51, 61 . . . Integrated circuits
52 . . . Device layer
53 . . . Photodiode
54 . . . Silicon dioxide film
55 . . . Shading film
56 . . . Silicon nitride film
58 . . . Microlens
59, 63 . . . Wiring layers
60 . . . Substrate support
62 . . . Semiconductor substrate
76 . . . Specific area image compressing unit
77 . . . Code amount assignment control unit
A1 . . . Optical low-pass filter
A2 . . . Color correction filter
A27 . . . color filter
C1 to C3 . . . Processing circuits

The invention claimed is:

1. An imaging apparatus comprising: image pickup means including a plurality of photoelectric converters arranged in a matrix from which image data is obtained by XY address control;
and a peripheral circuit connected to the photoelectric converters by a wiring layer formed on a surface of the image pickup means opposite a light-receiving surface of the image pickup means and held integrally with the image pickup means to process image data provided by the image pickup means and to provide the processed image data,
wherein the peripheral circuit includes at least image compressing means compressing the image data and providing the compressed image data, the image compressing means including:
a specific area image compressing unit compressing sub-image data obtained by a sub-set of the plurality of photoelectric converters and providing a first code amount;
a code amount assignment control unit estimating a second code amount for the image data based on the first code amount and determining a data compressing ratio based on the estimated second code amount;
and a total area image compressing unit compressing the image data based on the data compressing ratio,
wherein the specific area image compressing unit and the total area image compressing unit are different units,
wherein the image data is obtained in a sequence corresponding to the processing of the image data by the image compressing means,
and wherein the sequence is one of a line sequence, a column sequence, or a block sequence.

2. The imaging apparatus according to claim 1, wherein the image compressing means compresses the image data by transforming the image data into coefficient data and quantizing the coefficient data by quantizing means, and
the quantizing means quantizes the coefficient data by a quantization scale corresponding to the data compressing ratio.

3. The imaging apparatus according to claim 1, wherein the specific area image compressing unit and the total area image compressing unit are included in separate systems, respectively.

4. The imaging apparatus according to claim 1, wherein the peripheral circuit underlies the wiring layer.

5. The imaging apparatus according to claim 4, wherein the peripheral circuit and the image pickup means are fabricated by separate wafer processing processes, respectively.

6. An integrated circuit for an image pickup device, the integrated circuit comprising: image pickup means including a plurality of photoelectric converters arranged in a matrix from which image data is obtained by XY address control,
and a peripheral circuit connected to the photoelectric converters by a wiring layer formed on a surface of the image pickup means opposite a light-receiving surface of the image pickup means and held integrally with the image pickup means to process image data provided by the image pickup means and to provide the processed image data, wherein the peripheral circuit includes at least image compressing means compressing the image data and providing compressed image data, the image compressing means including:
a specific area image compressing unit compressing sub-image data obtained by a sub-set of the plurality of photoelectric converters and providing a first code amount;
a code amount assignment control unit estimating a second code amount for the image data based on the first code amount and determining a data compressing ratio based on the estimated second code amount;
and a total area image compressing unit compressing the image data based on the data compressing ratio,
wherein the specific area image compressing unit and the total area image compressing unit are different units,
wherein the image data is obtained in advance in a sequence corresponding to the processing of the image data by the image compressing means,
and wherein the sequence is one of a line sequence, a column sequence, or a block sequence.

7. An imaging apparatus comprising: an image pickup unit including a plurality of photoelectric converters arranged in a matrix from which image data is obtained by XY address control;
and a peripheral circuit connected to the photoelectric converters by a wiring layer formed on a surface of the image pickup unit opposite a light-receiving surface of the image pickup unit and held integrally with the image pickup unit to process image data provided by the image pickup means and to provide the processed image data,
wherein the peripheral circuit includes at least image compressing unit compressing the image data and providing the compressed image data, the image compressing unit including:
a specific area image compressing sub-unit compressing sub-image data obtained by a sub-set of the plurality of photoelectric converters and providing a first code amount;
a code amount assignment control sub-unit estimating a second code amount for the image data based on the first code amount and determining a data compressing ratio based on the estimated second code amount;
and a total area image compressing sub-unit compressing the image data based on the data compressing ratio,
wherein the specific area image compressing sub-unit and the total area image compressing sub-unit are different sub-units,
wherein the image data is obtained in advance in a sequence corresponding to the processing of the image data by the image compressing unit,
and wherein the sequence is one of a line sequence, a column sequence, or a block sequence.

8. An integrated circuit for an image pickup device, the integrated circuit comprising:
an image pickup unit including a plurality of photoelectric converters arranged in a matrix from which image data is obtained by XY address control;
and a peripheral circuit connected to the photoelectric converters by a wiring layer formed on a surface of the image pickup unit opposite a light-receiving surface of the image pickup unit and held integrally with the image pickup unit to process image data provided by the image pickup unit and to provide the processed image data, wherein the peripheral circuit includes at least an image compressing unit compressing the image data and providing the compressed image data, the image compressing unit including:
a specific area image compressing sub-unit compressing sub-image data obtained by a sub-set of the plurality of photoelectric converters and providing a first code amount;
a code amount assignment control sub-unit estimating a second code amount for the image data based on the first code amount and determining a data compressing ratio based on the estimated second code amount;
and a total area image compressing sub-unit compressing the image data based on the data compressing ratio,
wherein the specific area image compressing sub-unit and the total area image compressing sub-unit are different sub-units,
wherein the image data is obtained in advance in a sequence corresponding to the processing of the image data by the image compressing unit,
and wherein the sequence is one of a line sequence, a column sequence, or a block sequence.

9. An image data processing method to be carried out by an imaging apparatus including image pickup means including a plurality of photoelectric converters arranged in a matrix,
and a peripheral circuit connected to the photoelectric converters by a wiring layer formed on a surface of the image pickup means opposite a light-receiving surface of the image pickup means and held integrally with the image pickup means, the image processing method comprising the steps of:
providing image data from the image pickup means by XY address control, the image data being provided in a sequence corresponding to the processing of the image data by the peripheral circuit and the sequence being one of a line sequence, a column sequence, or a block sequence;
compressing, by a specific area image compressing unit, sub-image data of the image data corresponding to a sub-set of the photoelectric converters and providing the compressed sub-image data at least by the peripheral circuit;
obtaining a first code amount based on the compressed sub-image data;
estimating a second code amount for the image data based on the first code amount;
determining a data compressing ratio based on the estimated second code amount;
and compressing, by a total area image compressing unit, the image data at the data compressing ratio,
wherein the specific area image compressing unit and the total area image compressing unit are different units.

10. An image data processing method to be carried out by an integrated circuit included in an image pickup device including image pickup means including a plurality of photoelectric converters arranged in a matrix, and a peripheral circuit connected to the photoelectric converters by a wiring layer formed on a surface of the image pickup means opposite a light-receiving surface of the image pickup means and held integrally with the image pickup means, the image data processing method comprising the steps of:
providing image data from the image pickup means by XY address control, the image data being provided in a sequence corresponding to the processing of the image data by the peripheral circuit and the sequence being one of a line sequence, a column sequence, or a block sequence;

compressing, by a specific area image compressing unit, sub-image data of the image data corresponding to a sub-set of the photoelectric converters and providing the compressed sub-image data at least by the peripheral circuit;

obtaining a first code amount based on the compressed sub-image data;

estimating a second code amount for the image data based on the first code amount;

determining a data compressing ratio based on the estimated second code amount;

and compressing, by a total area image compressing unit, the image data at the data compressing ratio, wherein the specific area image compressing unit and the total area image compressing unit are different units.

* * * * *